(12) United States Patent
Seddon et al.

(10) Patent No.: US 11,114,329 B2
(45) Date of Patent: Sep. 7, 2021

(54) METHODS FOR LOADING OR UNLOADING SUBSTRATE WITH EVAPORATOR PLANET

(71) Applicant: SEMICONDUCTOR COMPONENTS INDUSTRIES, LLC, Phoenix, AZ (US)

(72) Inventors: Michael J. Seddon, Gilbert, AZ (US); Heng Chen Lee, Seremban (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 74 days.

(21) Appl. No.: 16/734,540

(22) Filed: Jan. 6, 2020

(65) Prior Publication Data

US 2020/0321235 A1 Oct. 8, 2020

Related U.S. Application Data

(60) Provisional application No. 62/830,803, filed on Apr. 8, 2019.

(51) Int. Cl.
| | |
|---|---|
| *H01L 21/687* | (2006.01) |
| *H01L 21/677* | (2006.01) |
| *H01L 21/683* | (2006.01) |
| *H01L 21/68* | (2006.01) |
| *H01L 21/02* | (2006.01) |

(52) U.S. Cl.
CPC .. *H01L 21/68707* (2013.01); *H01L 21/02269* (2013.01); *H01L 21/6773* (2013.01); *H01L 21/67766* (2013.01); *H01L 21/67781* (2013.01); *H01L 21/68* (2013.01); *H01L 21/681* (2013.01); *H01L 21/6836* (2013.01)

(58) Field of Classification Search
None
See application file for complete search history.

(56) References Cited

U.S. PATENT DOCUMENTS

| | | | | |
|---|---|---|---|---|
| 3,983,838 | A * | 10/1976 | Christensen | .......... C23C 14/505 118/730 |
| 4,817,556 | A * | 4/1989 | Mears | ............... H01L 21/67778 118/503 |
| 4,979,464 | A * | 12/1990 | Kunze-Concewitz | ...................... H01L 21/67769 118/719 |
| 5,040,484 | A * | 8/1991 | Mears | ............... H01L 21/68764 118/503 |
| 6,083,357 | A * | 7/2000 | Begin | ..................... C23C 14/34 204/192.1 |
| 9,218,990 | B2 * | 12/2015 | Fairhurst | ........... H01L 21/68764 |
| 2001/0044266 | A1 * | 11/2001 | Katsuoka | .............. B24B 41/061 451/66 |
| 2021/0013084 | A1 * | 1/2021 | Schaller | ............ H01L 21/68771 |

* cited by examiner

*Primary Examiner* — Gerald McClain
(74) *Attorney, Agent, or Firm* — Adam R. Stephenson, LTD.

(57) ABSTRACT

Implementations of methods of loading an evaporator may include, using a robotic arm, removing a substrate from a cassette and centering the substrate on a substrate aligner. The method may include aligning the substrate using the substrate aligner. The substrate may also include removing the substrate from the substrate aligner using the robotic arm and loading the substrate into a first available pocket of a planet of an evaporator using the robotic arm. The method may also include rotating the planet to a second available pocket after detecting a presence of the substrate in the first available pocket.

20 Claims, 2 Drawing Sheets

METHODS FOR LOADING OR UNLOADING SUBSTRATE WITH EVAPORATOR PLANET

CROSS REFERENCE TO RELATED APPLICATIONS

This application claims the benefit of the filing date of U.S. Provisional Patent Application 62/830,803, entitled "EVAPORATOR SUBSTRATE LOADING SYSTEMS AND RELATED METHODS" to Seddon et al., which was filed on Apr. 8, 2019, the disclosure of which is hereby incorporated entirely herein by reference.

BACKGROUND

1. Technical Field

Aspects of this document relate generally to systems and methods for automatically loading substrates into machines. More specific implementations involve loading substrates using robotics.

2. Background

Semiconductor substrates are used to form a wide variety of semiconductor devices. The semiconductor devices are generally distributed across a planar surface of the semiconductor substrate in a plurality of die. A metal layer may be formed on a side of the semiconductor substrate opposite the plurality of die as a back metal layer.

SUMMARY

Implementations of methods of loading an evaporator may include: using a robotic arm, removing a substrate from a cassette and centering the substrate on a substrate aligner. The method may include aligning the substrate using the substrate aligner. The method may also include removing the substrate from the substrate aligner using the robotic arm and loading the substrate into a first available pocket of a planet of an evaporator using the robotic arm. The method may also include rotating the planet to a second available pocket after detecting a presence of the substrate in the first available pocket.

Implementations of methods of loading an evaporator may include one, all, or any of the following:

Detecting the absence of the substrate from the robotic arm after loading the substrate into a first available pocket using one of an optical sensor or a vacuum sensor.

The presence of the substrate in the first available pocket may be detected using a sensor.

The method may further include loading additional substrates into the planet until there are no available pockets.

There may be no carrier coupled to the substrate.

The substrate may have an average thickness of less than 39 microns.

The substrate may have an average thickness of less than 10 microns.

The substrate may be coupled to a backgrinding tape.

Implementations of methods of unloading an evaporator may include: providing an evaporator planet having a plurality of pockets. Each pocket may have a substrate loaded thereon. The method may include removing one of the plurality of substrates from one of the pockets in the planet using a robotic arm. The method may include placing the substrate on a substrate aligner using the robotic arm and centering the substrate using the substrate aligner. The method may include removing the substrate from the substrate aligner using the robotic arm. The method may include placing the substrate into the cassette using the robotic arm.

Implementations of methods of unloading an evaporator may include one, all, or any of the following:

The method may include detecting substrates in the cassette using optical sensors in the cassette.

The method may include repeating removing the substrates until there are no substrates in any of the pockets.

The method may include detecting a presence of the substrate using a sensor in the robotic arm.

The substrate may have an average thickness of less than 39 microns.

Each of the plurality of substrates may include an evaporated layer of material on a side of the plurality of substrates.

The method may further include removing the single semiconductor wafer from the cassette.

Implementations of methods of loading and unloading a substrate on an evaporator may include: loading the substrate by: providing a substrate having a first side and a second side opposite the first side. The first side of the substrate may include an active area. The substrate may be included within a cassette. The method may include using a robotic arm, unloading the wafer from the cassette onto a substrate aligner and aligning the substrate using the substrate aligner. The method may include using the robotic arm, loading the substrate into an available pocket in an evaporator planet, and rotating the evaporator planet to another available pocket. Unloading the substrate may include: rotating the evaporator planet to a pocket containing the substrate. The method may include unloading the substrate from the pocket using the robotic arm. The method may include loading the substrate into the substrate aligner using the robotic arm and aligning the substrate using the substrate aligner. The method may include unloading the substrate from the substrate aligner using the robotic arm, and loading the wafer into the cassette, using the robotic arm.

Implementations of methods of loading and unloading a substrate on an evaporator may include:

The unloaded substrate may include a material on the second side of the substrate.

The substrate may not be coupled to a carrier.

The substrate may be coupled to a backgrinding tape.

The wafer may include an average thickness of less than 39 microns.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

Figure 1:
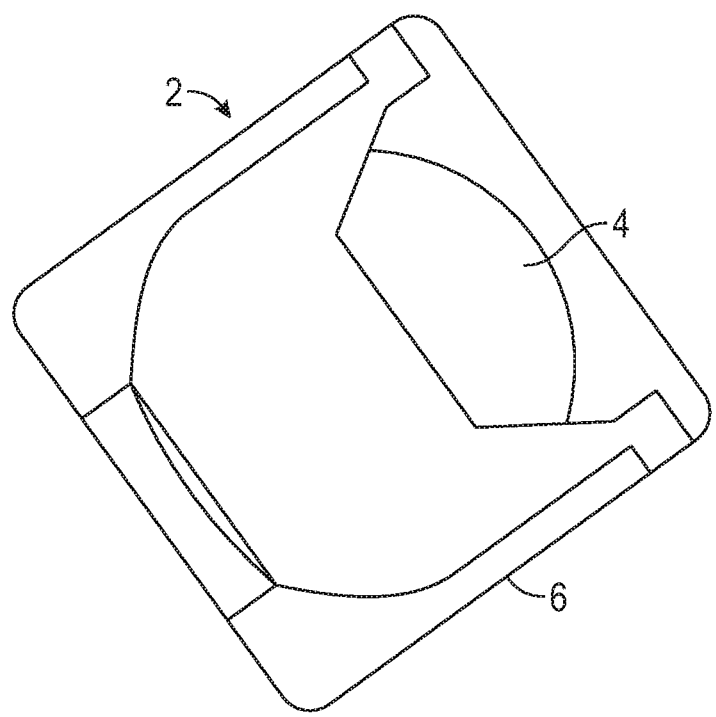
FIG. 1 is a top view of an implementation of a substrate cassette.

This disclosure, its aspects and implementations, are not limited to the specific components, assembly procedures or method elements disclosed herein. Many additional components, assembly procedures and/or method elements known in the art consistent with the intended substrate loading systems will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such substrate loading systems, and implementing components and methods, consistent with the intended operation and methods.

For semiconductor substrates that have an average thickness of less than about 40 microns in thickness, particular processing challenges exist. Die handling, die strength, and performing processing operations with the die and substrates all present specific challenges, as die and substrate breakage can significantly reduce yield and/or affect device reliability. Damage may also occur as part of the process of forming a metal layer on a second side of the wafer. The substrate may be damaged while removing the substrate from a carrier.

The term "substrate" refers to a semiconductor substrate as a semiconductor substrate is a common type of substrate, however, "substrate" is not an exclusive term that is used to refer to all semiconductor substrate types. Similarly, the term "substrate," may refer to a wafer as a wafer is a common type of substrate, however, "wafer" is not an exclusive term that is used to refer to all wafers. The various semiconductor substrate types disclosed in this document that may be utilized in various implementations may be, by non-limiting example, round, rounded, square, rectangular, or any other closed shape. In various implementations, the substrate may include a substrate material such as, by non-limiting example, single crystal silicon, silicon dioxide, glass, gallium arsenide, sapphire, ruby, silicon on insulator, silicon carbide, polycrystalline or amorphous forms of any of the foregoing, and any other substrate material useful for constructing semiconductor devices. In particular implementations, the substrate may be a silicon-on-insulator substrate.

In various implementations disclosed in this document, the semiconductor substrate includes a plurality of semiconductor die that have been processed using a semiconductor fabrication process to form one or more semiconductor devices therein or thereon (not shown). The plurality of die have been processed on a first side or active side of the semiconductor substrate. This may include forming a plurality of layers on a first side the substrate. The plurality of layers may be patterned, and in various implementations, may be patterned (or otherwise removed) to not be over a die street in the substrate. The plurality of layers may include, by non-limiting example, one or more metal layers, one or more passivation layers, any other layer, and any combination thereof In various implementations, the plurality of die may include power semiconductor devices, such as, by non-limiting example, a MOSFET, an IGBT, or any other power semiconductor device. In other implementations, the plurality of die may include non-power semiconductor devices.

Following the completion of the fabrication process (or during some portion of it, in some implementations), the semiconductor substrate is thinned on a side of the semiconductor substrate that is opposite the side on which the one or more semiconductor devices have been formed to a desired substrate thickness. The thinning process takes place using backgrinding, lapping, etching, any combination thereof, or any other technique for removing the material of the semiconductor substrate substantially uniformly across the largest planar surface of the substrate.

In various implementations, the substrate may be thinned to an average thickness less than 50 microns ($\mu$m). As used herein, "average thickness" is a substrate average thickness across at least a majority of the largest planar surface of the substrate. In other implementations, the substrate may be thinned to an average thickness less than 30 $\mu$m. In still other implementations, the substrate may be thinned to an average thickness less than 100 $\mu$m, more than 100 $\mu$m, and in other various implementations, the substrate may not be thinned. In particular implementations, the substrate may be thinned to an average thickness of about 25 $\mu$m, and in other particular implementations, the substrate may be thinned to an average thickness of about 75 $\mu$m. The substrate may be thinned through backgrinding, etching, or any other thinning technique.

In various implementations, the thinning process may create an edge ring around the substrate. An example of a backgrinding process that creates an edge right is the backgrinding process marketed under the tradename TAIKO by Disco Hi-Tec America, Inc. of Santa Clara, Calif. The edge ring acts to structurally support the substrate following thinning so that no carrier may need to be utilized during subsequent processing steps. In various implementations, the thinning process may be carried out after the semiconductor substrate has been mounted to a backgrinding tape whether an edge ring is formed during backgrinding or not. A wide variety of backgrinding tapes may be employed in various implementations, including those that are compatible with subsequent plasma etching operations. In other implementations, the semiconductor substrate may not be coupled to a backgrinding tape.

In various implementations, following the thinning process a metal layer is applied to a second side of the semiconductor substrate. In some implementations, the metal layer may be referred to as a backside metal layer or back metal layer. In various implementations, the back metal layer may be copper or a copper alloy. In some implementations, the metal may include tungsten, tin, gold, titanium, aluminum, silver, nickel, chromium, alloys thereof, or any combination thereof In other implementations, the backside metal layer may include any other type of metal, alloy thereof, or combination thereof. In various implementations, the backside metal layer may be about 10 $\mu$m thick. In other implementations, the backside metal layer may be more or less thick than 10$\mu$m. The back metal layer may include various layers including adhesion and/or diffusion barrier layers in various implementations as well.

For thin wafers in the range from about 5-39 microns sputtering metal deposition processes apply too much energy into the thinned substrate. As a result, sputtering increases the temperature of the substrate and can overheat the thin substrate, due to its very low thermal mass, in a short amount of time. In various processes, the substrate over heats in a few seconds before the sputtering process can be successfully completed. The thermal energy comes from ion bombardment that occurs during the sputtering process and the cooling of the sputtered metal on the wafer. The energy may also come from infrared heating from the plasma formed around the substrate. Slowing down the sputtering process to decrease the energy and heat the substrate is subjected to may slow down the process too much for current desired processing cycle times to be reached. Cooling chucks may also not be a feasible tool for use with ultrathin substrates in a sputtering chamber. An electrostatic chuck may not work with ultrathin substrates because insufficient capacitance is generated by the thinned substrate to allow it to couple with the chuck due to the small amount of semiconductor material that remains in the substrate.

Figure 3:
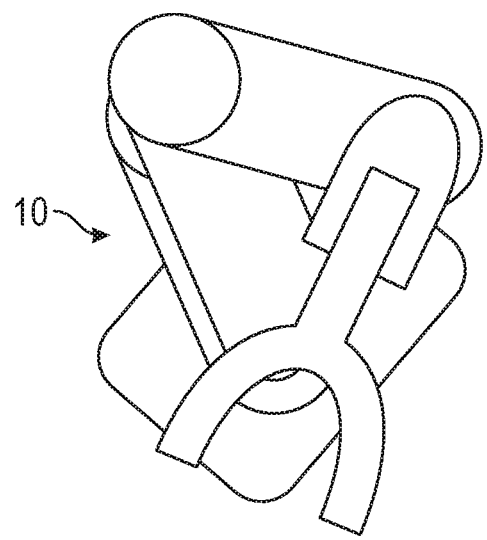
FIG. 3 is a top view of an implementation of a robotic arm.

In contrast with the heating that invariably is present when a sputtering process is used to apply metal, use of an evaporation process does not result in overheating of the substrate material. This is at least because no plasma is struck over the substrate during the process and the evaporation process is a material condensation process from metal vapor generated within a vacuum chamber. In various method implementations disclosed herein, the layers of material may be formed using evaporation. A layer of material may be formed on a substrate using an implementation of an evaporation method. In various implementations, the layer of material may include a metal layer. The evaporation process may be carried out in an evaporator dome. Due to the delicate nature of thin substrates, a method for automatically loading a substrate into an evaporator dome may be required. In various implementations, the method may include using a robotic arm as illustrated in FIG. 3. Implementations of the robotic arm may include a vacuum to securely hold the substrate in various methods of loading in the substrate into the evaporator dome. In some implementations, the robotic arm may include a sensor reading the vacuum on the robotic arm. In other implementations, the robotic arm may include an optical sensor, which is separate from the vacuum. In still other implementations, the robotic arm may include grippers to hold the substrate. In other implementations, the robotic arm may include a table to hold the substrate. In other implementations, the robotic arm may have a Bernoulli end effector to transport the thinned wafer. Bernoulli end effectors create a low pressure region that the wafer rests on allowing the wafer to be moved without the arm actually touching the wafer. In various other implementations, various combinations of sensors and structures may be employed to allow the robotic arm to sense the substrate while transporting it and hold onto the substrate.

Referring now to FIG. 1, a substrate cassette 2 is illustrated. The cassette 2 may include an opening 4 for holding the substrate. In some implementations, the cassette may include sensors to detect the presence of a substrate in the opening. In other implementations, the evaporator tool itself may include an optical sensor or other cassette reading sensor to detect the presence of substrates in the cassette slots. The optical sensor may work to identify the presence of substrates in specific slots in the cassette through detecting interruption of light beams being received by the sensor as the light is blocked by each substrate in the cassette as the optical sensor scans the cassette. The optical or other sensor may also be used to detect the absence of a substrate in the opening. In other words, the optical or other sensor may also be able to detect when the cassette opening is empty and available to receive a substrate. The cassette 2 may also be mounted onto a cassette holder 6. In various implementations, a user may manually inspect and load a cassette onto a cassette holder and enter the numbers of the slots, which include substrates into a user interface of the wafer handling control system of the evaporator prior to automatically loading a substrate into an evaporator planet. In various implementations, the methods and systems described herein may be used in high volume processing fabrication operations that involve evaporation.

Figure 2:
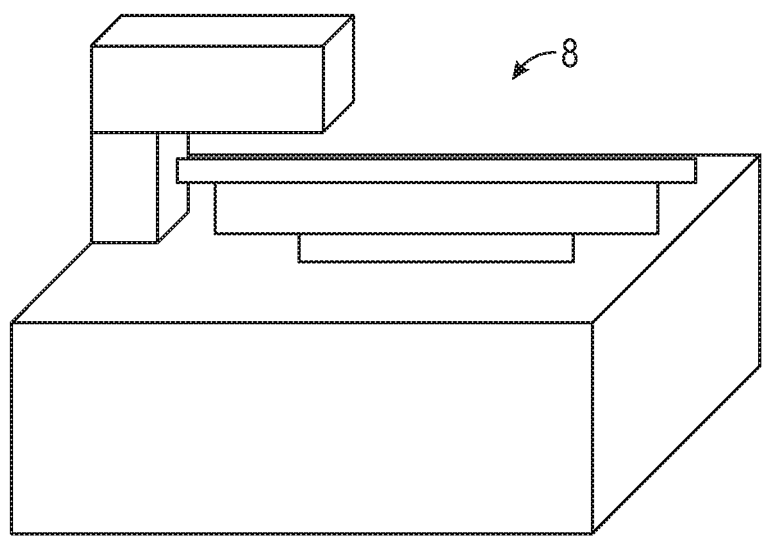
FIG. 2 is a side view of an implementation of a substrate aligner.

An implementation of a method for loading a substrate into an evaporator planet may include providing a substrate. The substrate may have a first side and a second side. The first side may include an active area. In various implementations, the substrate may be mounted on a tape. The tape may be a backgrinding tape. In some implementations, the substrate is can be coupled/bonded to a carrier (including a carrier wafer or carrier substrate). In other implementations, the wafer may have an edge support ring. The substrate may be comprised within the opening 4 of the cassette. Using a robotic arm, such as the robotic arm 10 illustrated in FIG. 3, the substrate may be unloaded from the cassette 2 and loaded onto a substrate aligner 8. The substrate aligner may be similar in structure to the aligner illustrated in FIG. 2 in various implementations. As used herein, aligning the substrate may include determining the location of the edges of the substrate/wafer, finding the notch or flat of the substrate/wafer, and/or determining the theta rotation of the substrate/wafer. In some implementations, aligning the substrate/wafer may not include determining the theta rotation of the substrate/wafer or finding a notch or a flat of the substrate/wafer. In various implementations, the aligner may include a sensor. The sensor may be an optical sensor. In some implementations, the optical sensor may be a camera. The optical sensor may be used to read the substrate numbers on the second side of the substrates (or other identifying marks) and verify the lot number of the substrate to ensure that all of the substrates that are supposed to be in the lot are present and the lot is actually supposed to undergo processing in this particular evaporator. In other implementations, the robotic arm 10 may include a sensor that can read a substrate number/identifier included on the wafer. In still other implementations, the end effector of the robotic arm 10 may align/identify the substrate itself to locate the sides of the substrate or locate a notch or flat present in the substrate without the use of a separate freestanding aligner.

Figure 4:
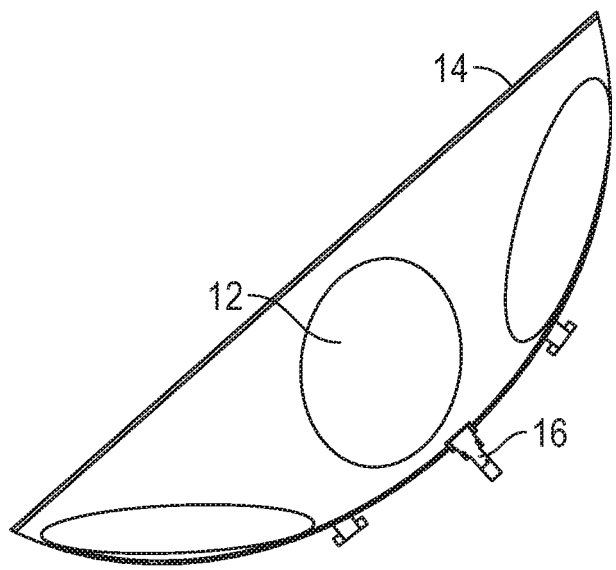
FIG. 4 is a side view of an implementation of an evaporator planet.
Figure 5:
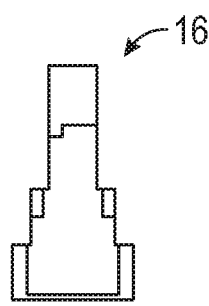
FIG. 5 is a side view of a sensor/camera for sending the presence of a substrate in a pocket of an evaporator planet.

The method may further include using the robotic arm 10 to remove the aligned/identified substrate from the aligner 8 and load the substrate into an available pocket 12 of an evaporator planet 14. Referring to FIG. 4, an implementation of an evaporator planet 14 is illustrated. The evaporator planet may include a plurality of pockets 12. Each of the plurality of pockets may be configured to receive a substrate. In various implementations, the wafer may be loaded from the back of the planet. In other implementations, the wafer may be loaded from the front of the planet. The method may further include sensing the presence of the substrate within a pocket of the evaporator planet. The presence of the substrate may be detected by a sensor including a camera 16. An enlarged view of the camera 16 is illustrated in FIG. 5. In some implementations, the camera 16 could be placed on the inner side of the planet. When the camera or other sensor is located on the inner surface of the planet it may need to be shielded during the evaporation process. In various implementations, the sensor may be an optical sensor. In still other implementations, the sensor may a pressure sensor, a weight sensor, an object proximity sensor, an infrared sensor, an ultrasonic sensor, or any other sensor type capable of recognizing the presence of the wafer in the pocket. The method may also include detecting the absence of the substrate in the robotic arm to verify the substrate has been deposited into the evaporator dome. The method may also include rotating the evaporator planet 14 to another available pocket 12 and continuing to load substrates until all the available pockets on the planet have a substrate loaded thereon (or all the substrates in the cassette have been loaded into an available pocket in the planet).

In various implementations, the substrates may include semiconductor wafers. The semiconductor wafers may be loaded into the wafer having the second side of the wafer facing away from the pocket. In some implementations, the methods described herein may be used in high volume processing facilities. Implementations of loading a substrate into an evaporator planet may be used as part of a method for depositing a metal layer onto a substrate. Once the substrate has been loaded into the evaporator, one or more metal layers may be evaporated onto a side of the substrate.

A method for evaporating a metal layer onto a substrate may include providing a crucible within the evaporator dome. In various implementations, the crucible may contain one compartment or may include multiple compartments, each acting as its own crucible. Within the different compartments are different materials that may be evaporated onto a side of a substrate. In various implementations, the metal layer may be deposited onto a backside of a substrate as the evaporated metal vapor from the crucible(s) condense onto the exposed backside of the substrate. The materials in the compartments/crucibles may be metals including but not limited to, tungsten, copper, titanium, gold, nickel, silver, tin, alloys thereof, any combination thereof, or any other metals used for back metallization or seed metal on a non-active side of a wafer. In particular implementation, various wafers/substrates may be positioned a predetermined distance above the crucible in the pockets of the evaporator planet. A heating element may be positioned under the crucible. In various implementations, the heating element may be an inductive heating element and may be positioned around the crucible. The method may include, in various implementations, using a radio frequency (RF) generator to operate the heating element to heat the crucible to cause one or more of the materials in the crucible to vaporize and couple to the second side of the wafers.

In various other evaporation method implementations, the heating of the crucible may include resistive heating or electron beam heating. During the resistive heating process, the material in the crucible may be in a high-vacuum environment and heated to its evaporation point by heating of the crucible using an electrically resistive heating element. The vaporized molecules/atoms then travel from the source to the substrate/wafer where they nucleate together on the substrate/wafer, forming a thin film coating. A wide variety of materials can be deposited using this technique such as aluminum, silver, nickel, chrome, copper, tin, magnesium, or any other materials mentioned herein.

In electron beam heating implementations, current is first passed through a filament which leads to heating of the filament and subsequent electron emission. High voltage is applied between the filament and the hearth to accelerate liberated electrons towards the crucible containing the material to be deposited. A strong magnetic field focuses the electrons into a unified beam; upon arrival, the energy of this beam of electrons is transferred to the deposition material, causing it to evaporate (or sublimate) and eventually deposit onto the substrate/wafer. Adding a partial pressure of reactive gas, such as oxygen or nitrogen to the chamber during evaporation can be used to reactively deposit non-metallic film materials on the substrates in the planet pockets.

In some implementations of a method of forming a metal layer on a side of a substrate, the various compartments of the crucible may be covered during operation to exclude particular materials from coupling to the side of the wafer during a deposition step. In other implementations, two or more compartments may be uncovered at the same time to form a metal coating including a combination of materials. Sequential covering and uncovering of various compartments may be used in various evaporation methods to form layers of various materials one on each other.

After a substrate has been processed in the evaporator planet 14 with a desired evaporation/sublimation process, the substrate may be removed from the pocket 12 of the evaporator planet 14. The method includes rotating the evaporator planet 14 to a pocket 12 containing the substrate. Using the robotic arm 10, the method includes unloading the substrate from the pocket 12. The robotic arm 10 may include a vacuum device like a wafer wand or a non-contact Bernoulli handler. In various implementations, the robotic arm may include grippers to use in handling the substrate. The method may include loading the substrate into the aligner 8 using the robotic arm 10 and aligning the substrate in the aligner 8. The substrate may be aligned through notch alignment or through the numbers on the substrate. The method may include unloading the substrate from the substrate aligner 8 and loading the substrate into the cassette 2. In various implementations, sensors within the robotic arm may be used to align the wafer. With aligning sensors within the robotic arm, a separate aligner may not be needed. In various implementations, aligning the wafer may also include verifying the notch or flat of the substrate and/or the identification number/identifier of the substrate.

In various other implementations of methods of loading a substrate into an evaporator planet 14, a substrate may be removed from a cassette 2 using a robotic arm 10. The robotic arm 10 may be any implementation described herein. The substrate may then be aligned using the substrate aligner through, by non-limiting example, a notch alignment process. The substrate may be removed from the aligner using the robotic arm and loaded into the first available pocket of a planet of an evaporator using the robotic arm. In various implementations, the substrate may be mounted onto a mounting tape, a picking tape, a backgrinding tape, or any other tape used to support and stabilize a substrate having an average thickness less than 39 microns. In some implementations, the substrate may include an edge support ring. The methods described herein may support a thin or ultrathin substrate without the use of a carrier bonded to the substrate. The method may include rotating the planet to a second available pocket after detecting a presence of the substrate in the first available pocket and loading additional substrates in the planet 14 until there are no available pockets 12. The presence of a plurality of substrates within the pockets 12 of the planet 14 may be detected through a sensor on the planet 14. In various implementations, the sensor may be a camera 16.

After loading the substrate into the planet the substrate may be processed using any evaporation method disclosed in this document. One implementation of processing a substrate may include forming a metal layer on a side of the substrate opposite any devices on the substrate. In various implementations, the substrate may have a thickness of less than 39 microns. In some implementations, the substrate may have an average thickness of about 10 microns. In other implementations, the substrate may have an average thickness of about 25 microns. Wafers having average thicknesses between about 5-39 microns may crack during removal from standard carriers such as glass plates, carrier wafers, wafer holders, or other standard wafer carriers used in semiconductor substrate handling. Various implementations of a processing method may include the substrate having an edge ring disposed around a perimeter of the substrate. In such implementations, the edge ring of the wafer may be handled with tweezers. In some implementations, the wafer may be handled with a vacuum device like a wafer wand or a non-contact Bernoulli handler. In various implementations, a first side of the semiconductor wafer may be coupled to a tape. The tape may be, by non-limiting example, a backgrinding tape, a picking tape, or various other tapes for securing and stabilizing a semiconductor wafer. In other implementations, the semiconductor wafer may not be coupled to a tape.

The method for forming a metal layer on the substrate may include heating a material in a crucible to a vapor using any of the heating methods disclosed in this document. In various implementations, an inductive heating system may be employed. The material may couple with a side 26 of the semiconductor substrate, thereby depositing the material on the side of the wafer and forming a coating. In various implementations, the evaporator dome may rotate during vaporize of the material to aid in deposition of an even coating of material on the side of the semiconductor wafer. The substrate may be coupled into an opening in the evaporator dome resembling an orange slice peel. For wafers having a diameter of 6 inches, 32 wafers may be processed in a single evaporator in various implementations. In other implementations, 12 wafers may be processed in a single evaporator of the same size with wafers having a diameter of 8 inches. In various other implementations, the evaporator may be otherwise designed to allow for processing of wafers with diameters greater than 8 inches.

After forming the metal layer on the substrate additional processing steps may be performed following removal of the wafer/substrate from the evaporator system. Removal of the substrate from an evaporator planet 14 including a plurality of pockets 12 with each pocket 12 having a substrate loaded therein may include removing one of the plurality of substrates from one of the pockets 12 in the planets 14 using the robotic arm 10. Following application of material using evaporation, the method may include placing the substrate on a substrate aligner 8 using the robotic arm 10. However, as previously described, in various implementations, the robotic arm may be used to identify and align the substrate without use of a separate aligner. The robotic arm 10 may also be used to remove the substrate from the aligner 8 and place the substrate in the cassette 2. In some implementations, the cassette may be completely empty before removal of the substrates from the evaporator planet. In other implementations, the cassette may be partially filled. Sensors like any disclosed in this document may be used to detect the presence and location of substrates in the cassette in order to direct the robotic arm where to place processed substrates. The method may further include repeating removing the remaining substrates from the plurality of pockets until the evaporator planet is empty.

After removal of the substrates from the evaporator planet, the substrates may be further processed. Additional processing steps may include singulating the plurality of semiconductor die from the wafer. Singulating may include plasma etching, lasering, sawing, or other methods of die singulation. In some implementations, singulation may be performed from the backside/second side of the wafer. Singulation may include aligning the wafer using aligning features on a front side of the wafer. The aligning features may be included in the streets between the plurality of die. In various implementations, the aligning features may be located on an edge of the die. When the wafer is aligned, a plurality of alignment marks may be formed on a second side of the wafer through lasering, sawing, or scribing. Scribing may include using a stylus or scribing tool. The plurality of alignment marks may resemble perforation marks on the second side of the wafer. The plurality of alignment marks may be detectable with a visible light camera or with an infrared camera. Singulation methods may also include forming grooved lines in the backside of the wafer using sawing, lasering, or scribing. The metal layer may have a remaining thickness of 1 micron in the groove lines. The plurality of die may be then singulated through sawing or lasering through the groove lines.

Additional alignment methods may include applying photoresist to a second side of a wafer before application of a metal layer and patterning the photoresist. The photoresist may prevent the metal layer from forming in the areas covered by the photoresist. After forming the metal layer, the photoresist may then be removed to reveal two or more alignment marks protected during the metal deposition process. Alignment features within the die streets or die in the areas not covered by the photoresist may be detectable through the two or more alignment marks using visible light cameras or infrared cameras.

In places where the description above refers to particular implementations of methods of loading substrates into an evaporator and implementing components, sub-components, methods and sub-methods, it should be readily apparent that a number of modifications may be made without departing from the spirit thereof and that these implementations, implementing components, sub-components, methods and sub-methods may be applied to other methods of loading substrates into an evaporator.

What is claimed is:

1. A method for loading a substrate into an evaporator, the method comprising:
   using a robotic arm, removing a substrate from a cassette and centering the substrate on a substrate aligner;
   aligning the substrate using the substrate aligner;
   removing the substrate from the substrate aligner using the robotic arm;
   loading the substrate into a first available pocket of a planet of an evaporator using the robotic arm; and
   rotating the planet to a second available pocket after detecting a presence of the substrate in the first available pocket.

2. The method of claim 1, further comprising detecting the absence of the substrate from the robotic arm after loading the substrate into a first available pocket using one of an optical sensor or a vacuum sensor.

3. The method of claim 1, wherein the presence of the substrate in the first available pocket is detected using a sensor.

4. The method of claim 1, further comprising loading additional substrates in the planet until there are no available pockets.

5. The method of claim 1, wherein there is no carrier coupled to the substrate.

6. The method of claim 1, wherein the substrate comprises an average thickness of less than 39 microns.

7. The method of claim 1, wherein the substrate comprises an average thickness of less than 10 microns.

8. The method of claim 1, wherein the substrate is coupled to a backgrinding tape.

9. A method for unloading a substrate from an evaporator dome, the method comprising:

providing an evaporator planet comprising a plurality of pockets, each pocket comprising a substrate loaded thereon;

removing one of the plurality of substrates from one of the pockets in the planet using a robotic arm;

placing the substrate on a substrate aligner using the robotic arm and centering the substrate using the substrate aligner;

removing the substrate from the substrate aligner using the robotic arm; and placing the substrate into a cassette using the robotic arm.

10. The method of claim 9, further comprising detecting substrates in the cassette using optical sensors in the cassette.

11. The method of claim 9, further comprising: repeating removing each of the substrates until there are no substrates in any of the plurality of pockets.

12. The method of claim 9, further comprising detecting a presence of the substrate using a sensor in the robotic arm.

13. The method of claim 9, wherein the substrate has an average thickness of less than 39 microns.

14. The method of claim 9, wherein each substrate includes an evaporated layer of material on a side of the substrate.

15. The method of claim 9, further comprising removing the substrate from the cassette.

16. A method for loading and unloading a substrate into an evaporator, the method comprising:

loading a substrate by:

providing a substrate having a first side and a second side opposite the first side, wherein the first side of the substrate comprises an active area, the substrate comprised within a cassette;

using a robotic arm, unloading the substrate from the cassette onto a substrate aligner;

aligning the substrate using the substrate aligner; and using the robotic arm, loading the substrate into an available pocket in an evaporator planet, rotating the evaporator planet to another available pocket; and unloading the substrate by:

rotating the evaporator planet to a pocket containing the substrate;

unloading the substrate from the pocket using the robotic arm;

loading the substrate into the substrate aligner using the robotic arm;

aligning the substrate using the substrate aligner;

unloading the substrate from the substrate aligner using the robotic arm; and loading the substrate into the cassette, using the robotic arm.

17. The method of claim 16, wherein the unloaded substrate comprises a material on the second side of the substrate.

18. The method of claim 16, wherein the substrate is not coupled to a carrier.

19. The method of claim 16, wherein the substrate is coupled to a backgrinding tape.

20. The method of claim 16, wherein the substrate comprises an average thickness of less than 39 microns.

* * * * *